US012387026B2

(12) United States Patent
Fang et al.

(10) Patent No.: US 12,387,026 B2
(45) Date of Patent: Aug. 12, 2025

(54) METHOD FOR AUTOMATIC CONTROL OF SIMULATION ERROR IN ANALOG CIRCUIT AND USE THEREOF

(71) Applicants: Bayes Electronics Technology Co., Ltd, Shaoxing (CN); Tessersoft Co., Ltd, Hangzhou (CN)

(72) Inventors: Gang Fang, Shaoxing (CN); Wei Dong, Hangzhou (CN); Huanyu Liu, Hangzhou (CN); Zhenxin Zhao, Hangzhou (CN); Haojie Zhu, Hangzhou (CN); Ziqing Wang, Hangzhou (CN); Wei Wang, Hangzhou (CN)

(73) Assignees: Bayes Electronics Technology Co., Ltd, Shaoxing (CN); Tessersoft Co., Ltd, Hangzhou (CN)

( * ) Notice: Subject to any disclaimer, the term of this patent is extended or adjusted under 35 U.S.C. 154(b) by 0 days.

(21) Appl. No.: 18/985,139

(22) Filed: Dec. 18, 2024

(65) Prior Publication Data

US 2025/0200262 A1     Jun. 19, 2025

(30) Foreign Application Priority Data

Dec. 19, 2023   (CN) .......................... 202311751942.9

(51) Int. Cl.
*G06F 30/367*     (2020.01)
(52) U.S. Cl.
CPC ................. *G06F 30/367* (2020.01)
(58) Field of Classification Search
USPC ........................................................ 716/102
See application file for complete search history.

(56) References Cited

U.S. PATENT DOCUMENTS

| 5,790,436 A | 8/1998 | Chen et al. |
| 2008/0020712 A1* | 1/2008 | Meagher ............ G01R 31/2846 |
| | | 455/67.14 |
| 2016/0232269 A1* | 8/2016 | Rajagopalan ......... G06F 30/367 |

FOREIGN PATENT DOCUMENTS

| CN | 101154242 A | 4/2008 |
| CN | 103761138 A | 4/2014 |

(Continued)

OTHER PUBLICATIONS

Wu Cao, et al., An improved current control strategy based on particle swarm optimization and steady-state error correction for SAPF, IEEE Transactions on Industry Applications, 2019, pp. 4268-4274, vol. 55, No. 4.

(Continued)

*Primary Examiner* — Mohammed Alam
(74) *Attorney, Agent, or Firm* — Bayramoglu Law Offices LLC

(57) ABSTRACT

A method for automatic control of a simulation error in an analog circuit and a use thereof are provided. The method first determines a measurement object and acquires a simulation standard by simulating the measurement object. Then, the method performs simulation based on different parameters of a circuit netlist to acquire an electrical parameter and/or circuit performance evaluation indicator of the measurement object during a simulation process. The method forms a simulation sampling dataset based on a simulation option combination parameter and an error corresponding to the simulation standard. Finally, the method optimizes and analyzes the simulation sampling dataset based on an artificial intelligence algorithm to acquire a simulation option combination that meets a simulation error requirement and (Continued)

takes a least time. The solution achieves automatic selection of the simulation option combination, improving the accuracy of the simulation result.

16 Claims, 1 Drawing Sheet

(56) References Cited

FOREIGN PATENT DOCUMENTS

| | | |
|---|---|---|
| CN | 110119570 A | 8/2019 |
| CN | 110135090 A | 8/2019 |
| CN | 110245436 A | 9/2019 |
| CN | 110688810 A | 1/2020 |
| CN | 112417803 A | 2/2021 |
| CN | 115713057 A | 2/2023 |
| CN | 116227410 A | 6/2023 |
| CN | 117150821 A | 12/2023 |

OTHER PUBLICATIONS

Gao Song, et al., Error Criteria on Power System Dynamic Simulation Validation, Automation of Electric Power Systems, 2006, pp. 6-10, vol. 30, No. 4.

\* cited by examiner

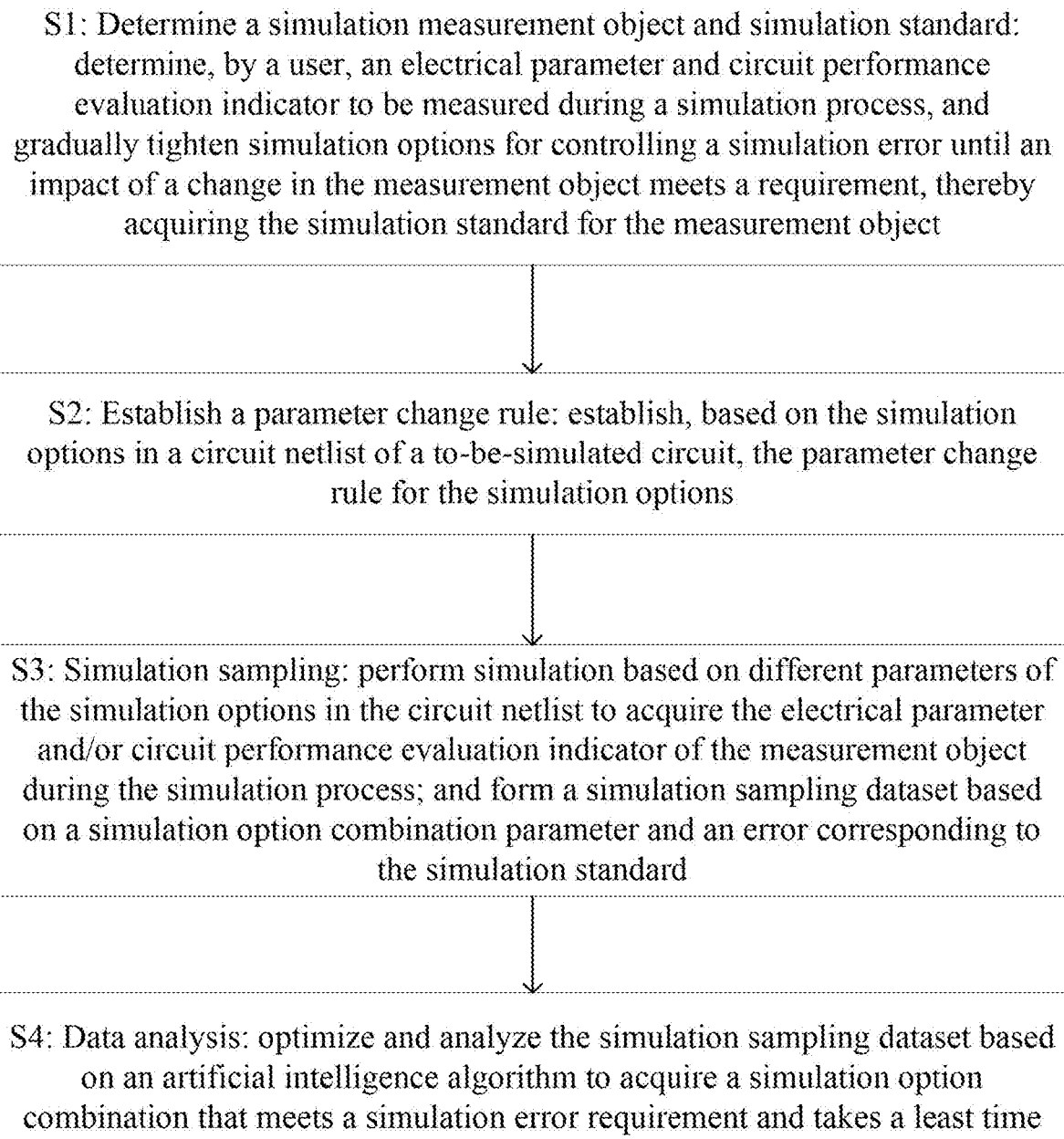

METHOD FOR AUTOMATIC CONTROL OF SIMULATION ERROR IN ANALOG CIRCUIT AND USE THEREOF

CROSS-REFERENCE TO THE RELATED APPLICATIONS

This application is based upon and claims priority to Chinese Patent Application No. 202311751942.9, filed on Dec. 19, 2023, the entire contents of which are incorporated herein by reference.

TECHNICAL FIELD

The present disclosure relates to the technical field of electron circuit simulation, and in particular to a method for automatic control of a simulation error in an analog circuit and a use thereof.

BACKGROUND

In the field of electronic engineering, the job of analog circuit designers is to design and optimize various analog circuits, such as amplifiers, filters, and oscillators. In order to ensure that a designed circuit meets performance requirements and reliability standards, designers need to conduct simulation analysis on the circuit.

Simulation is a computer-aided design method. By simulating circuit behavior on a computer, circuit performance and stability can be predicted to help designers discover potential problems before practical applications, thereby saving time and costs. Currently, when simulating a new type of circuit, analog circuit designers need to repeatedly adjust the error control option combination in the general simulator in order to achieve satisfactory accuracy and fast simulation speed. There is still significant room for optimization in this method from the perspective of simulation efficiency and quality.

SUMMARY

An objective of the present disclosure is to propose a method for automatically adjusting error control options and acquiring an optimal combination during an analog circuit simulation process.

The present disclosure provides the following basic solution. A method for automatic control of a simulation error in an analog circuit includes the following steps:

S1: determining a simulation measurement object and simulation standard: determining, by a user, an electrical parameter and circuit performance evaluation indicator to be measured during a simulation process, and gradually tightening simulation options for controlling a simulation error until an impact of a change in the measurement object meets a requirement, thereby acquiring the simulation standard for the measurement object;

S2: establishing a parameter change rule: establishing, based on the simulation options in a circuit netlist of a to-be-simulated circuit, the parameter change rule for the simulation options;

S3: simulation sampling: performing simulation based on different parameters of the simulation options in the circuit netlist to acquire the electrical parameter and/or circuit performance evaluation indicator of the measurement object during the simulation process; and forming a simulation sampling dataset based on a simulation option combination parameter and an error corresponding to the simulation standard; and S4: data analysis: optimizing and analyzing the simulation sampling dataset based on an artificial intelligence algorithm to acquire a simulation option combination that meets a simulation error requirement and takes a least time.

Furthermore, the step S2 includes: establishing the circuit netlist of the to-be-simulated circuit in batches based on the simulation options for controlling the simulation error, in order to facilitate simulation and acquire corresponding simulation data.

Furthermore, the method includes: sampling, based on a Latin hypercube sampling (LHS) method, a circuit netlist parameter.

Furthermore, the parameter change rule includes a rule for adjusting a step size and range of a parameter change.

Furthermore, the step S2 includes: establishing a batch parallel simulation job, and acquiring corresponding simulation data through parallel simulation.

Furthermore, the method includes: defining and managing a job dependency relationship and execution order through a data analysis tool/environment such as an open command environment for analysis (OCEAN) script.

Furthermore, the method includes: performing, by the parallel simulation job, batch job parallel processing using a distributed computing system, such as a x86 computing system including a load sharing facility (LSF) system of international business machines (IBM).

Furthermore, the method includes: generating multiple independent tasks from the parallel simulation job, and sending the tasks to the LSF system, where an identity (id) of each task in the LSF system facilitates parallel operation.

Furthermore, the step S4 includes: determining an error range through a presetting or user selection.

Furthermore, in the step S4, the artificial intelligence algorithm includes one or a combination of decision tree, random forest, logistic regression, neural network, and naive Bayes algorithms.

Furthermore, when the neural network algorithm is used for data optimization and analysis, a rectified linear unit (relu) function is used as an activation function.

Furthermore, when the neural network algorithm is used for data optimization and analysis, a mean square error (MSE) calculation equation and/or a cross entropy are used as a loss function, and the MSE calculation equation is as follows:

$$I(x, y) = \frac{1}{n}\sum_{i=1}^{N}(x_i - y_i)^2$$

where, n denotes a number of samples, yi denotes an actual value, and ŷi denotes a predicted value.

Furthermore, when the neural network algorithm is used for data optimization and analysis, a hyper-band Bayesian optimization algorithm is used to accelerate a search efficiency of a model.

Furthermore, when the neural network algorithm is used for data optimization and analysis, an evaluation function of an evolutionary algorithm is used as an optimization objective.

Furthermore, the method is used in a general circuit simulator or an analog design/verification platform.

Furthermore, in the step S1, the simulation options include relative error tolerance, voltage error tolerance, current error tolerance, error tolerance for controlling time-domain integration, and maximum step size.

Furthermore, in the step S3, an error control option negative-positive combination is used for automatic simulation.

A use of the method for automatic control of a simulation error in an analog circuit includes the following steps:
acquiring, according to a specific circuit type and the above method, the simulation standard and simulation option combination corresponding to the measurement object; and
encapsulating the simulation option combination into a callable module to implement a simulation use in a corresponding specific circuit.

The principle and advantages of the present disclosure are as follows.

1. The present disclosure first determines the measurement object and acquires the simulation standard by simulating the measurement object. Then, the present disclosure performs simulation based on different parameters of the circuit netlist to acquire the electrical parameter and/or circuit performance evaluation indicator of the measurement object during the simulation process. The present disclosure forms a simulation sampling dataset based on the simulation option combination parameter and the error corresponding to the simulation standard. Finally, the present disclosure optimizes and analyzes the simulation sampling dataset based on the artificial intelligence algorithm to acquire the simulation option combination that meets the simulation error requirement and takes the least time. This solution achieves automatic selection of the simulation option combination, reducing manual intervention and improving efficiency. The present disclosure improves the accuracy of simulation results by using the artificial intelligence algorithm for prediction. In addition, the present disclosure greatly reduces the amount of time and cost that a designer invests in repeatedly adjusting the error control option combination of a general simulator when simulating a new type of circuit.

BRIEF DESCRIPTION OF THE DRAWINGS

The FIGURE is a flowchart of a method for automatic control of a simulation error in an analog circuit according to Embodiment 1 of the present disclosure.

DETAILED DESCRIPTION OF THE EMBODIMENTS

The present disclosure is described in more detail below with reference to the specific implementations.

The specific implementation process is as follows:

Embodiment 1

As shown in the FIGURE, Embodiment 1 provides a method for automatic control of a simulation error in an analog circuit, including the following steps.

S1. A simulation measurement object and simulation standard are determined. An electrical parameter and circuit performance evaluation indicator to be measured during a simulation process are determined by a user. simulation gradually tightened options for controlling a simulation error are gradually tightened until an impact of a change in the measurement object meets a requirement, thereby acquiring the simulation standard for the measurement object.

S2. A parameter change rule is established. The parameter change rule is established for the simulation options based on the simulation options in a circuit netlist of a to-be-simulated circuit.

S3. Simulation sampling is performed. Simulation is performed based on different parameters of the simulation options in the circuit netlist to acquire the electrical parameter and/or circuit performance evaluation indicator of the measurement object during the simulation process. A simulation sampling dataset is formed based on a simulation option combination parameter and an error corresponding to the simulation standard.

S4. Data analysis is performed. The simulation sampling dataset is optimized and analyzed based on an artificial intelligence algorithm to acquire a simulation option combination that meets a simulation error requirement and takes a least time.

This solution is used in a general circuit simulator and can also be used on an analog design/verification platform in other embodiments. The present disclosure first determines the measurement object and acquires the simulation standard by simulating the measurement object. Then, the present disclosure performs simulation based on different parameters of the circuit netlist to acquire the electrical parameter and/or circuit performance evaluation indicator of the measurement object during the simulation process. The present disclosure forms a simulation sampling dataset based on the simulation option combination parameter and the error corresponding to the simulation standard. Finally, the present disclosure optimizes and analyzes the simulation sampling dataset based on the artificial intelligence algorithm to acquire the simulation option combination that meets the simulation error requirement and takes the least time. The present disclosure achieves automatic selection of the simulation option combination, improving the accuracy of simulation results. In addition, the present disclosure greatly reduces the amount of time and cost that a designer invests in repeatedly adjusting the error control option combination of a general simulator when simulating a new type of circuit.

Specifically, in the step S1, first, the user determines the electrical parameter and circuit performance evaluation indicator to be measured during the simulation process. The circuit performance evaluation indicator includes offset voltage, total harmonic distortion (THD), etc. In this embodiment, the circuit performance evaluation indicator is THD.

Then, the simulation options for controlling the simulation error is gradually tightened until the impact of the change in the measurement object meets the requirement, thereby acquiring the simulation standard for the measurement object. As shown in Table 1-1, the simulation options include relative error tolerance, voltage error tolerance, current error tolerance, error tolerance for controlling time-domain integration, and maximum step size. In this embodiment, the maximum step size is adjusted and gradually tightened to stop/50. At this point, the change in the measurement object can be ignored. Therefore, this is used as the simulation standard for the measurement object.

TABLE 1-1

Simulator parameters table

| Serial Number | Simulator parameters | Parameter description | Default value | Range | Simulation standard |
|---|---|---|---|---|---|
| 1 | reltol Relative error tolerance | Relative convergence criterion. | 0.001 | 0.001:1e−6 | 1e−6 |
| 2 | vabstol Absolute voltage error tolerance | Convergence criterion for absolute voltage criterion | 1e−6 | 1e−5:1e−8 | 1e−8 |
| 3 | iabstol Absolute current error tolerance | Convergence criterion for absolute current criterion | 1e−12 | 5e−10:2e−14 | 2e−14 |
| 4 | lteratio Error tolerance for controlling time-domain integration | Ratio used to compute LTE tolerances from Newton tolerance | 1 | 0.1:10 | 0.1 |
| 5 | maxstep Maximum step size | Maximum time step | stop/50 | stop/25:stop/500 | stop/500 |

In the step S2, after the simulation standard of the measurement object is acquired, the parameter change rule is established based on the circuit netlist parameter of the to-be-simulated circuit to generate a netlist in the subsequent process. Specifically, the parameter change rule includes a rule for adjusting the step size and range of the parameter change.

In the step S3, this solution performs simulation based on different parameters of the circuit netlist, acquires the electrical parameter and/or circuit performance evaluation indicator of the measurement object during the simulation process, and forms the simulation sampling dataset based on the simulation option combination parameter and the error corresponding to the simulation standard.

In this embodiment, the simulation is performed through the error control option negative-positive combination, and the error between the acquired circuit performance evaluation indicator and simulation standard, as well as the corresponding simulation time, is recorded. The training dataset is established from the simulation option combination to the error between the circuit performance evaluation indicator and simulation standard. Specifically, in this embodiment, according to the simulation standard and the LHS method, the circuit is randomly sampled on a large scale to acquire sample data. Afterwards, a batch parallel simulation job are established, the job dependency relationship and execution order are defined and managed through a data analysis tool/environment such as an OCEAN script, and corresponding simulation data is acquired through simulation.

In this embodiment, the parallel simulation job is used for batch job parallel processing using a distributed computing system, such as a x86 computing system including a LSF system of IBM. Specifically, multiple independent tasks are generated from the parallel simulation job, and then the tasks are sent to the LSF system. The id of each task in the LSF system facilitates parallel operation.

In an actual operation process, this solution involves a large amount of parallel computing in the training data acquisition process, which requires the use of the existing LSF system of IBM to handle the parallel job. That is, it is necessary to submit a job including multiple independent parallel tasks to the LSF system. But in the actual operation process, when one or more tasks take too long to execute or consume too much of a central processing unit (CPU) or memory, or the task program crashes, it is necessary to kill or rerun the task.

In the existing LSF system, the tasks of the parallel job do not have the same unique Id as the job in the LSF, so it is impossible to acquire the status of a specific task, and therefore it is impossible to perform operations such as kill and rerun on a task. Thus, only kill/rerun operations can be performed on the entire job, which brings great inconvenience to the work and causes waste of time and space.

Therefore, in this solution, independent tasks are generated from the parallel simulation job. Then, the tasks are sent to the LSF, and the id of the task in the LSF is acquired as the task id of the task, thereby achieving management of the parallel job and facilitating operations such as kill or run on one or a batch of tasks in the job, greatly saving operational time costs.

In the step S4, the error range is first determined through a presetting or user selection. Then, based on the artificial intelligence algorithm, the simulation sampling dataset is optimized and analyzed to acquire the simulation option combination that meets the simulation error requirement and takes the least time.

In this embodiment, the error range is ±0.05%, and the artificial intelligence algorithm is a neural network algorithm. In other embodiments, one or a combination of decision tree, random forest, logistic regression, neural network, and naive Bayes algorithms can also be used.

The commonly used activation functions in current neural network algorithms include sigmoid function, tan h function, and relu function.

The advantage of the sigmoid function is that the output mapping is monotonically continuous within (0,1), making it very suitable as an output layer and easy to differentiate. However, the sigmoid function has soft saturation. Once it falls into the saturation zone, $f(x)$ will become close to 0, which easily leads to gradient vanishing and makes it difficult for the training loss to converge.

The tan h function has soft saturation. Its output is centered around 0 and converges faster than sigmoid, but it still cannot solve the problem of gradient vanishing.

The advantages of the relu function are as follows. 1) The relu function has no saturation zone, and there is no gradient vanishing problem to prevent gradient dispersion. 2) The relu function has sparsity. 3) The relu function does not involve complex exponential operations, making it computationally simple and efficient. 4) The relu function actually converges fast, much faster than sigmoid/tanh. 5) The relu function is more in line with biological neural activation mechanisms than sigmoid.

Therefore, in this embodiment, the artificial neural network selects the relu function as the activation function, and other activation functions can also be adopted in other embodiments.

The relu function is expressed as follows:

$$\sigma(z) = \begin{cases} \max(0, x), & x \geq 0 \\ 0, & x < 0 \end{cases}$$

For regression problems, commonly used loss functions include mean square error (MSE), mean absolute error (MAE), and Huber loss.

In this embodiment, MSE is selected as the loss function, which is calculated as follows:

$$l(x, y) = \frac{1}{n}\sum_{i=1}^{N}(x_i - y_i)^2$$

In the equation, n denotes a number of samples, $y_i$ denotes an actual value, and $x_i$ denotes a predicted value. The function is smooth and can be optimized by a gradient descent method. When the predicted value is farther away from the true value, the penalty of the squared loss function is greater, so it can accurately learn the sparse interval of the sample.

In this embodiment, when the neural network algorithm is used for data optimization and analysis, a hyper-band Bayesian optimization algorithm is used to accelerate the search efficiency of the model, and an evaluation function of an evolutionary algorithm is used as an optimization objective.

In this solution, the hyper-parameter search problem is described as follows:

$$x^* = \mathrm{argmin}_{x \in X \subseteq R^d} f(x)$$

In the equation, x denotes a d-dimensional decision vector, X denotes a decision space, and $f$ denotes an objective function. Corresponding to the scenario, x can represent a hyper-parameter of an artificial neural network model, and $f(x)$ can represent an error of the model in predicting data on a test set. It involves finding an optimal set of hyper-parameters to ensure that the final trained artificial neural network model performs best on the test set. This is a typical black-box optimization problem.

Bayesian optimization is a highly effective global black-box optimization algorithm that aims to find the global optimal solution of Eq. (1). Bayesian optimization effectively solves the classic machine intelligence problem in sequential decision making theory: to find the next evaluation position based on the information acquired from the unknown objective function $f$ so as to achieve the optimal solution as quickly as possible. For example, if values $y_1$, $y_2$, and $y_3$ of the objective function are acquired from three different inputs $x_1$, $x_2$, and $x_3$ through evaluation, how should the next evaluation point be selected? The Bayesian optimization framework can acquire the optimal solution of complex objective functions through a few evaluations. Essentially, the Bayesian optimization framework uses a surrogate model to fit the true objective function and actively selects the most promising evaluation point for evaluation based on the fitting result, avoiding unnecessary sampling. Therefore, Bayesian optimization is also known as active optimization. Meanwhile, the Bayesian optimization framework can effectively utilize complete historical information to improve search efficiency.

The reason why the optimization is called Bayesian optimization is because the optimization process utilizes Bayes' theorem:

$$p(f \mid D_{1:t}) = \frac{p(D_{1:t}\mid f)p(f)}{p(D_{1:t})}$$

In the equation, $f$ denotes the unknown objective function (or parameter in the parametric model); $D_{1:t}=\{(x_1, y_1), (x_2, y_2), \ldots, (x_t, y_t)\}$ denotes an observed set, $x_t$ denotes a decision vector, $y_t=f(x_t)+\varepsilon_t$ denotes an observed value, and $\varepsilon_t$ denotes an observation error. $p(D_{1:t}\mid f)$ denotes a likelihood distribution of y, also known as "noise" due to the presence of an error in the observed value. $p(f)$ denotes a prior probability distribution of $f$, which is an assumption of the state of the unknown objective function. $p(D_{1:t})$ denotes a marginal likelihood distribution or "proof" of the marginal $f$. The marginal likelihood involves the product and integral of a probability density function, and it is often difficult to acquire a clear analytical expression. Therefore, the marginal likelihood is mainly used in Bayesian optimization to optimize hyper-parameters. $p(f\mid D_{1:t})$ denotes a posterior probability distribution of $f$. The posterior probability distribution describes a confidence of the unknown objective function after the prior is modified through the observed dataset.

The Bayesian optimization framework mainly includes two core parts, namely a probabilistic surrogate model and an acquisition function.

The probabilistic surrogate model includes a prior probability model and an observation model. The prior probability model is expressed as $p(f)$. The observation model describes the mechanism of generating observation data, namely the likelihood distribution $p(D_{1:t}\mid f)$. Updating the probabilistic surrogate model means acquiring the posterior probability distribution $p(f\mid D_{1:t})$ including more data information based on Eq. (2). Generally, a Gaussian process model is selected as the surrogate model.

The acquisition function is constructed based on the posterior probability distribution, and the next most promising evaluation point is selected by maximizing the acquisition function. Meanwhile, an effective acquisition function can ensure that the selected evaluation point sequence minimizes the total loss. The loss is sometimes expressed as regret:

$$r_t = |y^* - y_t|$$

It can also be expressed as cumulative regret:

$$R_t = \sum_{i=1}^{t} r_i$$

In the equation, y* denotes a current optimal solution. Generally, an expectation improvement algorithm is selected as the acquisition function.

The Bayesian optimization framework is an iterative process that mainly includes three steps. In step 1, the next most promising evaluation point $x_t$ is selected by maximizing the acquisition function. In step 2, the value $y_t=f(x_t)+\varepsilon_t$ of the objective function is evaluated based on the selected evaluation point $x_t$. In step 3, the newly acquired input-observation pair $\{x_t, y_t\}$ is added to the historical observation set $D_{1:t-1}$, and the probabilistic surrogate model is updated to prepare for the next iteration. Table 1-2 shows pseudocode of the Bayesian optimization framework.

TABLE 1-2

Pseudocode of the Bayesian optimization framework
Bayesian optimization algorithm $N_{init}$: number of initial sampling points, $N_{iter}$: number of iterations
1. Randomly sample $N_{init}$ points in the sampling space
2. Establish Gaussian model
3. for t=1,2,..., $N_{iter}$, do
4. Build an acquisition function;
5. Find the optimal $x_t$ for the acquisition function;
6. Sample $y_t=f(x_t)$;
7. Update the probabilistic surrogate model;
8. End for;
9. Return the optimal f(x) for the iterative process In addition, in this solution, in order to prevent data loss caused by crashes or accidental shutdowns of parallel job distribution and management software (LSP based multi-tasking parallel cloud computing tool), data is stored locally in json format when tasks are submitted and task states change, and the file is read and loaded into the memory at program startup.

The user inputs and submits the job name, directory path corresponding to the job, directory prefix of tasks, number of tasks, commands before task execution, commands for task execution, and the lifecycle of the job in the client interface. In the program, a unique job id is generated locally for the job. In another thread, for the tasks of the job, bsub is called in batches and submitted to the LSF system, and the id generated in the LSF is saved for the task. Thus, the list and status of the job and its tasks are acquired.

The user can also query the status and other related information of the job or task from local storage based on the job id or task id. In addition, another separate thread is responsible for calling bjobs to acquire the status of the task from LSF and update the corresponding status of the job based on the status of the task. Alternatively, based on the job id or task id, the user can query the status and other related information of the job or task locally. If the job has been completed or failed (with EXIT status), it cannot be killed. Otherwise, in another thread, for a task of the job that has been submitted to the LSF system but has not been completed, a bkill command is called to stop the task from running in the LSF. If the task of the job or a task to be killed has not been submitted to the LSF, its status is simply set to 'killed'.

The user can also query the status and other related information of the job or task locally based on the job id or task id. If the job has been completed or it has been submitted to the LSF but not yet completed (with PEND or RUN status), it cannot be rerun. Otherwise, in another thread, for a task of the job that is unsuccessful (with DONE status), the bsub command is called to submit the task to the LSF system, and its id generated by the LSF is saved.

The user needs to set the lifetime of the job when submitting it, which means that timing starts after the job is submitted. If all tasks are not completed within the set time window, that is, if a task of the job is not in the DONE or EXIT status, the program will automatically stop the task. A bkill command will be called to stop the task of the job that has been submitted to the LSF system but has not been completed (with PEND or RUN status), and the status of the task is recorded as KILLED.

In addition, the software is developed using Qt Creator 5.12.12, fully utilizing qt's signal and slot mechanism to emit corresponding signals when the statuses of the job and the task change, facilitating other modules to perform relevant processing such as data acquisition after receiving the signals. The program supports multi-threaded logging. From program startup to exit, there is always detailed log output for easy debugging and backtracking in case of problems.

Embodiment 2

The only difference between Embodiment 2 and Embodiment 1 is that Embodiment 2 is a use of the method for automatic control of a simulation error in an analog circuit, which includes the following steps.

According to a specific circuit type and the method for automatic control of a simulation error in an analog circuit according to Embodiment, the simulation standard and simulation option combination corresponding to the measurement object are acquired.

The simulation option combination is encapsulated into a callable module to implement a simulation use in a corresponding specific circuit.

In practical applications, in this embodiment, the simulation option combination in the above method for automatic control of a simulation error in an analog circuit is encapsulated as a callable module. The user only needs to acquire the optimization and analysis result of the simulation sampling dataset of the same type of circuit from the callable module based on the type of the circuit to be analyzed, that is, the simulation option combination that meets the simulation error requirement and takes the least time. In this way, the embodiment achieves the simulation use in the corresponding specific circuit.

The above are merely the embodiments of the present disclosure. Common knowledge such as well-known specific structures and characteristics in the solution are not detailed herein. Those skilled in the art know all the common technical knowledge in the technical field to which the present disclosure belongs before the filing date or the priority date, can access to all prior art in the field, and have the ability to apply conventional experimental means before the date. Those of ordinary skill in the field can improve and implement this solution in combination with their own abilities under the inspiration given in present disclosure. Some typical well-known structures or well-known methods should not be an obstacle for those skilled in the art to practice the present disclosure. It should be noted that those skilled in the art may further make several variations and improvements without departing from the scope of the present disclosure, but such variations and improvements should also be deemed as falling within the protection scope of the present disclosure without affecting the implementation effect and practicability of the patent. The scope of protection claimed in the present disclosure shall be subject to the content of the claims, and the specific implementations in the description may be intended to interpret the content of the claims.

What is claimed is:

1. A computer-implemented method for automatic formulation of a simulation error in a simulated analog circuit, comprising the following steps:
   S1: determining a simulation measurement object and simulation standard: determining, by a user, an electrical parameter and circuit performance evaluation indicator to be measured by a to-be-simulated circuit during a simulation process, and gradually tightening simulation options for controlling a simulation error until an impact of a change in the measurement object meets a requirement, wherein the simulation standard for the measurement object is acquired;

S2: establishing a parameter change rule: establishing, based on the simulation options in a circuit netlist of the to-be-simulated circuit, the parameter change rule for the simulation options, and establishing a batch parallel simulation job, and acquiring corresponding simulation data through parallel simulation;

S3: simulation sampling: performing simulation based on different parameters of the simulation options in the circuit netlist to acquire the electrical parameter and/or circuit performance evaluation indicator of the measurement object during the simulation process, wherein the performing simulation comprises generating multiple independent tasks from the parallel simulation job, sending the tasks to a distributed computing system, providing an identity (id) of each task in the distributed computing system to facilitate parallel operation, and performing, by the parallel simulation job, batch job parallel processing including the multiple independent tasks on the distributed computing system; and forming a simulation sampling dataset based on a simulation option combination parameter and an error corresponding to the simulation standard; and S4: data analysis: optimizing and analyzing the simulation sampling dataset based on an artificial intelligence algorithm to acquire a simulation option combination that meets a simulation error requirement and takes a least time.

2. The computer-implemented method for the automatic control of the simulation error in the simulated analog circuit according to claim 1, wherein the step S2 comprises: establishing the circuit netlist of the to-be-simulated circuit in batches based on the simulation options for controlling the simulation error, in order to facilitate simulation and acquire corresponding simulation data.

3. The computer-implemented method for the automatic control of the simulation error in the simulated analog circuit according to claim 2, wherein the method comprises: sampling, based on a Latin hypercube sampling (LHS) method, a circuit netlist parameter.

4. The computer-implemented method for the automatic control of the simulation error in the simulated analog circuit according to claim 1, wherein the parameter change rule comprises a rule for adjusting a step size and range of a parameter change.

5. The computer-implemented method for the automatic control of the simulation error in the simulated analog circuit according to claim 1, wherein the method comprises: defining and managing a job dependency relationship and execution order through a data analysis tool/environment.

6. The computer-implemented method for the automatic control of the simulation error in the simulated analog circuit according to claim 1, wherein the step S4 comprises: determining an error range through a presetting or user selection.

7. The computer-implemented method for the automatic control of the simulation error in the simulated analog circuit according to claim 1, wherein in the step S4, the artificial intelligence algorithm comprises one or a combination of decision tree, random forest, logistic regression, neural network, and naive Bayes algorithms.

8. The computer-implemented method for the automatic control of the simulation error in the simulated analog circuit according to claim 7, wherein when the neural network algorithm is configured for data optimization and analysis, a rectified linear unit (relu) function is configured as an activation function.

9. The computer-implemented method for the automatic control of the simulation error in the simulated analog circuit according to claim 7, wherein when the neural network algorithm is configured for data optimization and analysis, a mean square error (MSE) calculation equation and/or a cross entropy are configured as a loss function, and the MSE calculation equation is as follows:

$$l(x, y) = \frac{1}{n}\sum_{i=1}^{N}(x_i - y_i)^2$$

wherein n denotes a number of samples, yi denotes an actual value, and ŷi denotes a predicted value.

10. The computer-implemented method for the automatic control of the simulation error in the simulated analog circuit according to claim 7, wherein when the neural network algorithm is configured for data optimization and analysis, a hyper-band Bayesian optimization algorithm is configured to accelerate a search efficiency of a model.

11. The computer-implemented method for the automatic control of the simulation error in the simulated analog circuit according to claim 7, wherein when the neural network algorithm is configured for data optimization and analysis, an evaluation function of an evolutionary algorithm is configured as an optimization objective.

12. The computer-implemented method for the automatic control of the simulation error in the simulated analog circuit according to claim 1, wherein the method is configured in a general circuit simulator or an analog design/verification platform.

13. The computer-implemented method for the automatic control of the simulation error in the simulated analog circuit according to claim 1, wherein in the step S1, the simulation options comprise relative error tolerance, voltage error tolerance, current error tolerance, error tolerance for controlling time-domain integration, and maximum step size.

14. The computer-implemented method for the automatic control of the simulation error in the simulated analog circuit according to claim 1, wherein in the step S3, an error control option negative-positive combination is configured for automatic simulation.

15. A computer-assisted method for performing a simulation on a specific physical analog circuit, comprising:

S1: determining a simulation measurement object and simulation standard: determining, by a user, an electrical parameter and circuit performance evaluation indicator to be measured by a to-be-simulated circuit during a simulation process, and gradually tightening simulation options for controlling a simulation error until an impact of a change in the measurement object meets a requirement, wherein the simulation standard for the measurement object is acquired;

S2: establishing a parameter change rule: establishing, based on the simulation options in a circuit netlist of the to-be-simulated circuit, the parameter change rule for the simulation options;

S3: simulation sampling: performing simulation on a computing system based on different parameters of the simulation options in the circuit netlist to acquire the electrical parameter and/or circuit performance evaluation indicator of the measurement object during the simulation process; and forming a simulation sampling dataset based on a simulation option combination parameter and an error corresponding to the simulation standard; and S4: data analysis: optimizing and analyzing the simulation sampling dataset based on an artificial intelligence algorithm to acquire a simulation option combination that meets a simulation error requirement and takes a least time; and encapsulating the simulation option combination into a callable module and implementing the simulation option combination in the specific physical analog circuit to simulate an error in the specific analog circuit.

16. The computer-implemented method for the automatic control of the simulation error in the simulated analog circuit according to claim 8, wherein when the neural network algorithm is configured for data optimization and analysis, a mean square error (MSE) calculation equation and/or a cross entropy are configured as a loss function, and the MSE calculation equation is as follows:

$$I(x, y) = \frac{1}{n}\sum_{i=1}^{N}(x_i - y_i)^2$$

wherein n denotes a number of samples, yi denotes an actual value, and ŷi denotes a predicted value.

* * * * *